(12) United States Patent
Wong et al.

(10) Patent No.: US 8,298,871 B2
(45) Date of Patent: Oct. 30, 2012

(54) METHOD AND LEADFRAME FOR PACKAGING INTEGRATED CIRCUITS

(75) Inventors: Will K. Wong, Belmont, CA (US); Nghia T. Tu, San Jose, CA (US); Jaime A. Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/004,639

(22) Filed: Jan. 11, 2011

(65) Prior Publication Data

US 2011/0104854 A1  May 5, 2011

Related U.S. Application Data

(62) Division of application No. 11/961,842, filed on Dec. 20, 2007, now abandoned.

(51) Int. Cl.
*H01L 21/00* (2006.01)

(52) U.S. Cl. .................. 438/123; 257/673; 257/777

(58) Field of Classification Search .......... 257/673–777; 438/123
See application file for complete search history.

(56) References Cited

U.S. PATENT DOCUMENTS

| | | | |
|---|---|---|---|
| 5,438,224 A * | 8/1995 | Papageorge et al. .......... 257/777 |
| 5,596,225 A | 1/1997 | Mathew et al. |
| 5,677,567 A | 10/1997 | Ma et al. |
| 6,080,264 A | 6/2000 | Ball |
| 6,184,573 B1 | 2/2001 | Pu |
| 6,204,504 B1 | 3/2001 | Lewis |
| 6,204,544 B1 | 3/2001 | Wang et al. |
| 6,204,554 B1 | 3/2001 | Ewer et al. |
| 6,297,547 B1 | 10/2001 | Akram |
| 6,316,822 B1 | 11/2001 | Venkateshwaran et al. |
| 6,353,257 B1 | 3/2002 | Huang |
| 6,388,336 B1 | 5/2002 | Venkateshwaran et al. |
| 6,424,024 B1 | 7/2002 | Shih et al. |
| 6,479,888 B1 | 11/2002 | Hirashima et al. |
| 6,518,161 B1 | 2/2003 | Rajagopalan et al. |
| 6,577,012 B1 | 6/2003 | Greenwood et al. |
| 6,593,545 B1 | 7/2003 | Greenwood et al. |
| 6,645,791 B2 | 11/2003 | Noquil et al. |
| 6,700,189 B2 | 3/2004 | Shibata et al. |
| 6,723,585 B1 | 4/2004 | Tu et al. |

(Continued)

OTHER PUBLICATIONS

Office Action dated Oct. 1, 2009 in U.S. Appl. No. 11/691,429.

(Continued)

*Primary Examiner* — Jerome Jackson, Jr.
*Assistant Examiner* — Fang-Xing Jiang
(74) *Attorney, Agent, or Firm* — Wade J. Brady, III; Frederick J. Telecky, Jr.

(57) ABSTRACT

A leadframe suitable for use in the packaging of at least two integrated circuit dice into a single integrated circuit package is described. The leadframe includes a plurality of leads. Each of a first set of the plurality of leads has a first side and a second side substantially opposite the first side of the lead. Additionally, each of the first and second sides of the first set of leads each include at least two solder pads. Each solder pad on a lead of the first set of leads is isolated from other solder pads on the same side of the lead with at least one recessed region adjacent the solder pad. In various embodiments, I/O pads from at least two dice are physically and electrically connected to the opposing sides of the leads.

12 Claims, 9 Drawing Sheets

U.S. PATENT DOCUMENTS

| | | |
|---|---|---|
| 6,750,546 B1 | 6/2004 | Villanueva et al. |
| 6,798,044 B2 | 9/2004 | Joshi |
| 6,927,483 B1 | 8/2005 | Lee et al. |
| 6,953,988 B2 | 10/2005 | Seo et al. |
| 7,033,866 B2 * | 4/2006 | Chow et al. ............ 438/123 |
| 7,064,009 B1 | 6/2006 | McCann et al. |
| 7,067,904 B2 | 6/2006 | Wang et al. |
| 7,164,202 B2 | 1/2007 | Wang et al. |
| 7,250,685 B2 | 7/2007 | Shim et al. |
| 7,253,508 B2 | 8/2007 | Liu et al. |
| 7,619,303 B2 | 11/2009 | Bayan |
| 7,705,476 B2 | 4/2010 | Bayan et al. |
| 2001/0015488 A1 * | 8/2001 | Akram et al. .......... 257/686 |
| 2002/0093093 A1 * | 7/2002 | Paek ..................... 257/723 |
| 2003/0071344 A1 | 4/2003 | Matsuzawa et al. |
| 2003/0127746 A1 * | 7/2003 | Isaak et al. ............ 257/777 |
| 2003/0155634 A1 | 8/2003 | Yasunaga et al. |
| 2005/0156296 A1 | 7/2005 | Wang et al. |
| 2005/0167855 A1 | 8/2005 | Minamio et al. |
| 2005/0224945 A1 | 10/2005 | Saito et al. |
| 2006/0105501 A1 | 5/2006 | Kuah et al. |
| 2007/0262346 A1 | 11/2007 | Otremba et al. |
| 2008/0035959 A1 | 2/2008 | Jiang |
| 2008/0067667 A1 | 3/2008 | Mahler et al. |
| 2008/0135990 A1 | 6/2008 | Coyle et al. |
| 2008/0237814 A1 | 10/2008 | Bayan |
| 2009/0160039 A1 | 6/2009 | Wong et al. |

OTHER PUBLICATIONS

U.S. Appl. No. 11/961,798, filed Dec. 20, 2007.
Office Action in U.S. Appl. No. 11/691,429 dated Nov. 28, 2008.
Final Office Action in U.S. Appl. No. 11/691,429 dated Jun. 1, 2009.
Final Office Action in U.S. Appl. No. 11/936,017 dated Sep. 23, 2009.
Office Action in U.S. Appl. No. 11/936,017 dated Apr. 3, 2009.
Final Office Action in U.S. Appl. No. 11/936,017 dated Dec. 2, 2009.
U.S. Appl. No. 11/936,017, filed Nov. 6, 2007.
Office Action in U.S. Appl. No. 11/961,798 dated May 19, 2009.
U.S. Appl. No. 11/691,429, filed Mar. 26, 2007.
Notice of Allowance dated Feb. 23, 2010 in U.S. Appl. No. 11/936,017.
Final Office Action dated Oct. 15, 2010 in U.S. Appl. No. 11/961,842.
Office Action dated May 13, 2010 from U.S. Appl. No. 11/961,842.

* cited by examiner

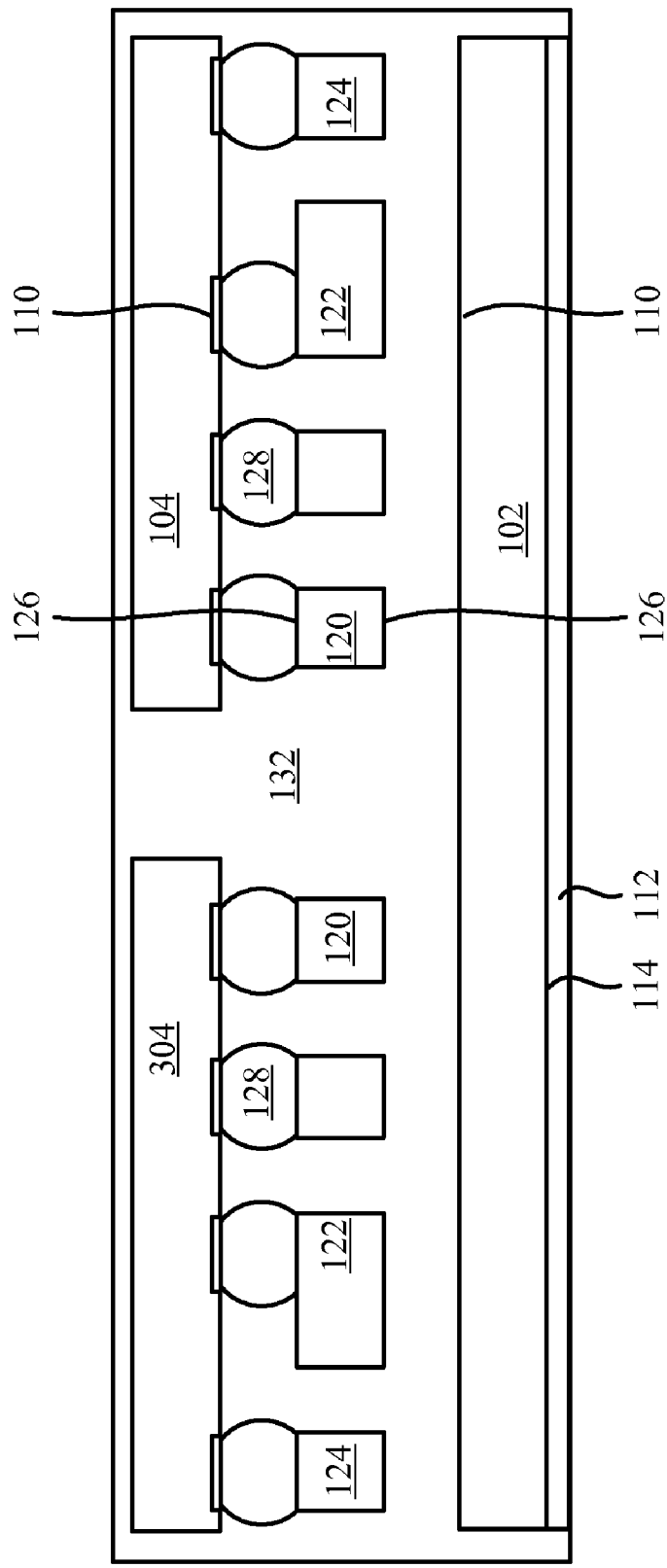

METHOD AND LEADFRAME FOR PACKAGING INTEGRATED CIRCUITS

CROSS-REFERENCE TO RELATED APPLICATION

This application is a Divisional of and claims priority to U.S. patent application Ser. No. 11/961,842, entitled "Method and Leadframe for Packaging Integrated Circuits," filed Dec. 20, 2007, which is hereby incorporated by reference in its entirety for all purposes.

TECHNICAL FIELD

The present invention relates generally to the packaging of integrated circuits (ICs). More particularly, an IC package is described that includes two IC dice that share common leads.

BACKGROUND OF THE INVENTION

There are a number of conventional processes for packaging integrated circuit (IC) dice. By way of example, many IC packages utilize a metallic lead frame that has been stamped or etched from a metal sheet to provide electrical interconnects to external devices. The die may be electrically connected to the lead frame by means of bonding wires, solder bumps, or other suitable electrical connections. In general, the die and portions of the lead frame are encapsulated with a molding material to protect the delicate electrical components on the active side of the die while leaving selected portions of the lead frame exposed to facilitate electrical connection to external devices.

In some applications, it is desirable to leave the back surface (opposite the active surface) of the die exposed; that is, not to encapsulate the back surface of the die with molding material. By way of example, it may be desirable to leave the back surface of the die exposed in order to increase heat dissipation out of the die. This is especially relevant for packages used in power applications. Increasing heat dissipation out of an IC die generally results in greater device performance and stability.

While existing arrangements and methods for packaging IC devices work well, there are continuing efforts to improve the thermal performance of IC devices.

SUMMARY OF THE INVENTION

In one aspect, an integrated circuit package is described that includes two dice. The active surface of each die includes a plurality of I/O pads. The active surface of the first die is positioned adjacent first sides of the leads of a leadframe such that I/O pads from the first die are arranged adjacent corresponding solder pads on the first sides. Similarly, the active surface of the second die is positioned adjacent second sides of the leads opposite the first surfaces such that I/O pads from the second die are arranged adjacent corresponding solder pads on the second sides. Each of a first set of selected leads includes at least two solder pads on each of the first and second sides of the lead. Each solder pad on a selected lead is isolated from other solder pads on the same side of the lead with at least one recessed region adjacent the solder pad. A plurality of solder joints are arranged to physically and electrically connect I/O pads from the first or second die to associated adjacent solder pads on the leads. The solder from each solder joint that contacts an associated solder pad surface on a selected lead is confined to the solder pad surface by one or more adjacent recessed regions. In this way, a single leadframe can be utilized to package two dice, one on either side of the leads of the leadframe.

In another aspect, a method of packaging at least two integrated circuit dice into a single integrated circuit package utilizing a single leadframe is described. A first die is positioned onto a first side of a leadframe such that I/O pads on the first die are positioned adjacent corresponding solder pads on first sides of selected leads of the leadframe. Solder bumps positioned between the I/O pads on the first die and the solder pads on the first sides of the leads are then reflowed to produce a first plurality of solder joints that physically and electrically connect the first die to the leads of the leadframe. Subsequently, the leadframe is positioned onto a set of spacers such that the first die is below the leadframe. The spacers are arranged to support the leadframe such that the die does not have to contact any other surface. A second die is positioned onto a second side of the leadframe opposite the first side of the leadframe such that I/O pads on the second die are positioned adjacent corresponding solder pads on second sides of the selected leads of the leadframe. Solder bumps positioned between the I/O pads on the second die and the solder pads on the second sides of the leads are then reflowed to produce a second plurality of solder joints that physically and electrically connect the second die to the leads of the leadframe. The spacers support the leadframe such that during the second reflowing the first plurality of solder joints are not compressed by the weight of the leadframe and are thus able to retain their shape.

BRIEF DESCRIPTION OF THE DRAWINGS

For a better understanding of the invention, reference should be made to the following detailed description taken in conjunction with the accompanying drawings, in which:

FIGS. 3A-B illustrate diagrammatic cross-sectional side and top views, respectively, of a three-die package in accordance with an embodiment of the present invention.

Like reference numerals refer to corresponding parts throughout the drawings.

DETAILED DESCRIPTION OF EXAMPLE EMBODIMENTS

The present invention relates generally to the packaging of integrated circuits (ICs). More particularly, an IC package is described that includes two IC dice that share common leads.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Various embodiments of the present invention will be described with reference to FIGS. 1-2. Aspects of the present invention provide an IC package that utilizes a leadframe in the packaging of at least two IC dice. The I/O pads on the active surfaces of the dice are physically and electrically connected with associated leads of the leadframe with solder joints. In some embodiments, the dice are packaged such that an exposed metallic layer deposited onto the back surface of at least one of the dice remains uncovered by molding compound used to encapsulate other portions of the dice, leads and solder joints.

Figure 1A:
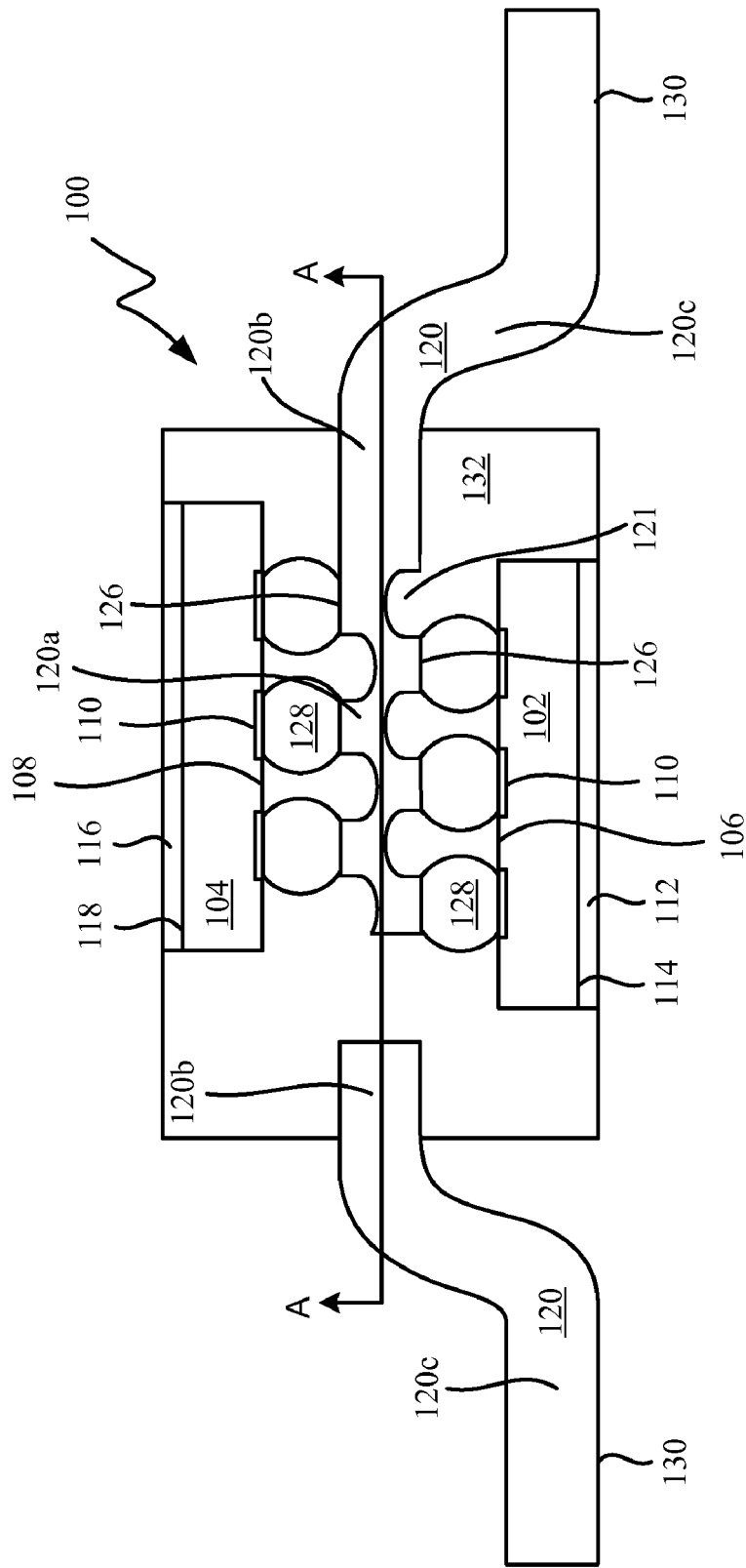
FIGS. 1A-D illustrate diagrammatic first cross-sectional side, second cross-sectional side, cross-sectional top and bottom views, respectively, of an IC package in accordance with an embodiment of the present invention.
Figure 1B:
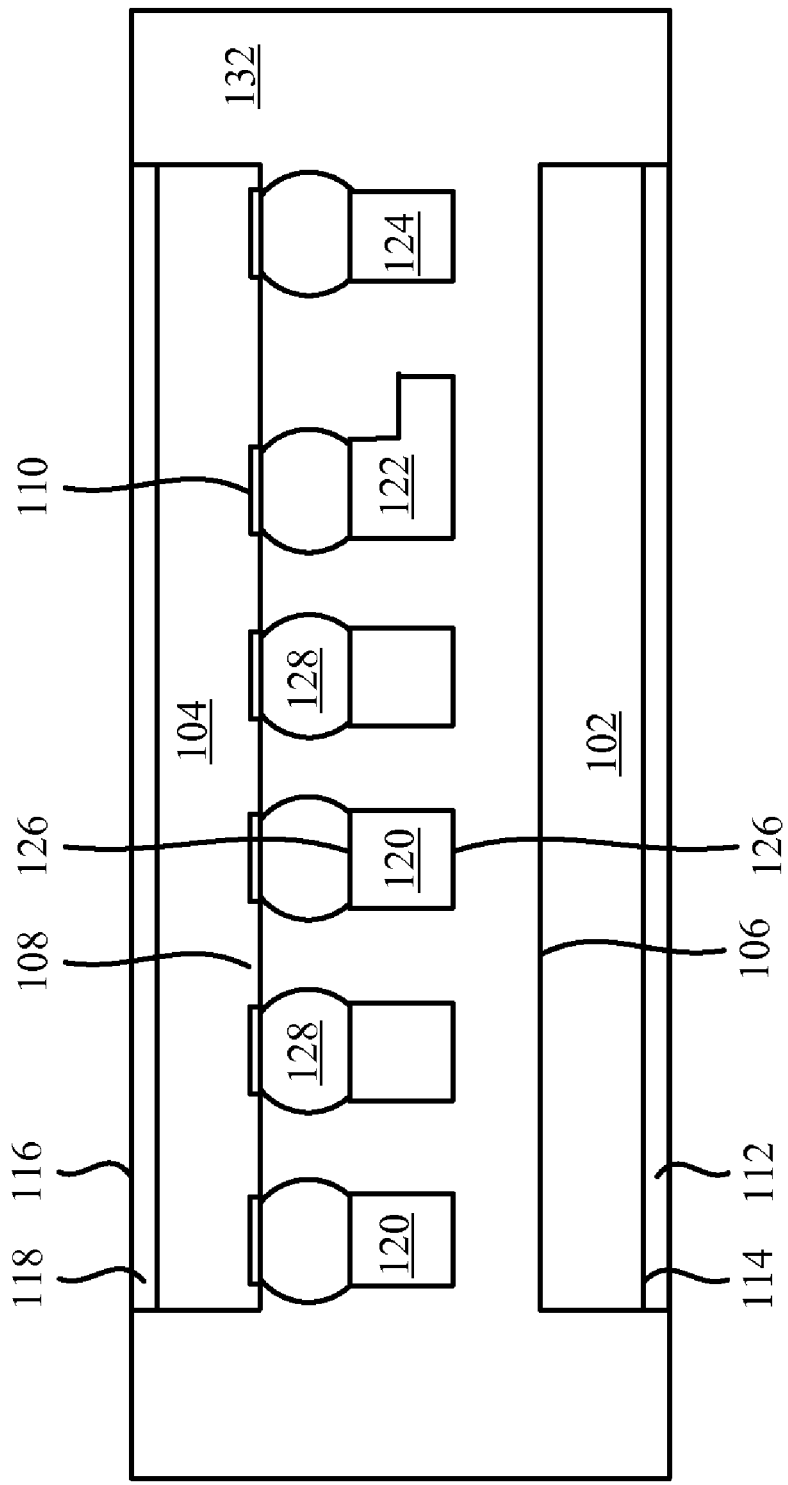
Figure 1C:
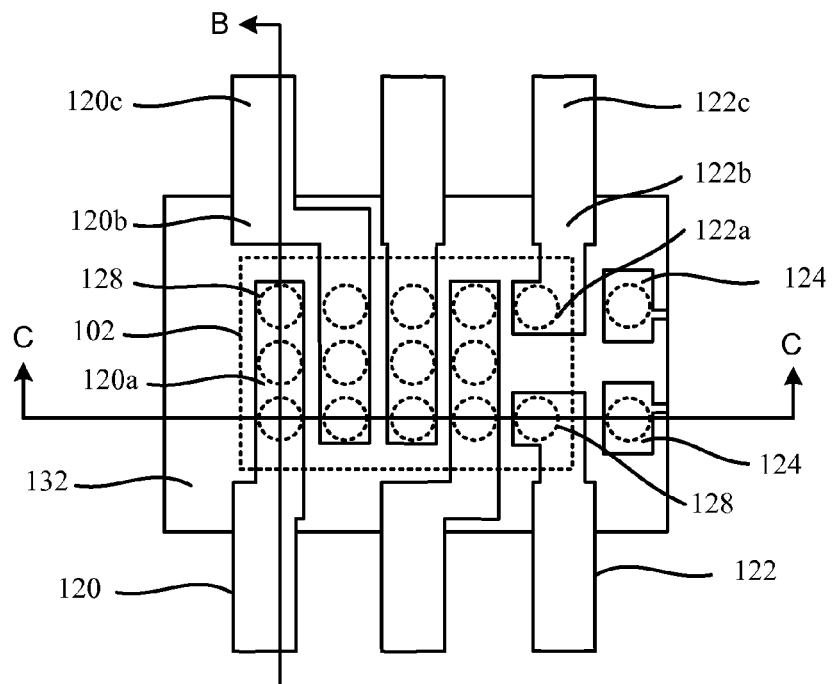

Referring initially to FIGS. 1A-1D, an IC package 100 is described. IC package 100 is particularly suitable for use in power applications. Generally, package 100 may be referred to as a flip-chip-on-lead (FCOL) type package. FIGS. 1A and 1B illustrate cross-sectional side views of package 100 taken along lines B-B and C-C, respectively, shown in FIG. 1C, which illustrates a cross-sectional top view of package 100 taken along line A-A of FIG. 1A. IC package 100 includes a first bottom IC die 102 and a second top IC die 104. In some embodiments, both of the dice 102 and 104 may be configured for use in power applications.

The first bottom die 102 and second top die 104 have active surfaces 106 and 108, respectively. The active surfaces 106 and 108 are arranged so as to face one another and each include a plurality of bond pads 110 (although the die 102 would be hidden from view, the perimeters of the die 102 and bond pads 110 associated with the die 102 are illustrated with a dotted line in FIG. 1C). In some particular embodiments, the active surfaces 106 and 108 are mirror images of one another. More specifically, if the active surface 108 of the second top die 104 is positioned over and adjacent the active surface 106 of the first bottom die 102, the bond pads 110 on the active surface 108 of the top die 104 may align with corresponding similar functioning bond pads 110 on the active surface 106 of the bottom die 102. The bond pads 110 may be the original bond pads on the active surface of the die 102 or other input/output (I/O) pads that have been redistributed from the bond pads using various redistribution techniques (hereinafter, bond pads will be used interchangeably with I/O pads). Additionally, in various embodiments, underbump metallizations (UBMs) may be formed on the bond pads 110 of the dice 102 and 104 prior to solder bumping.

Figure 1D:
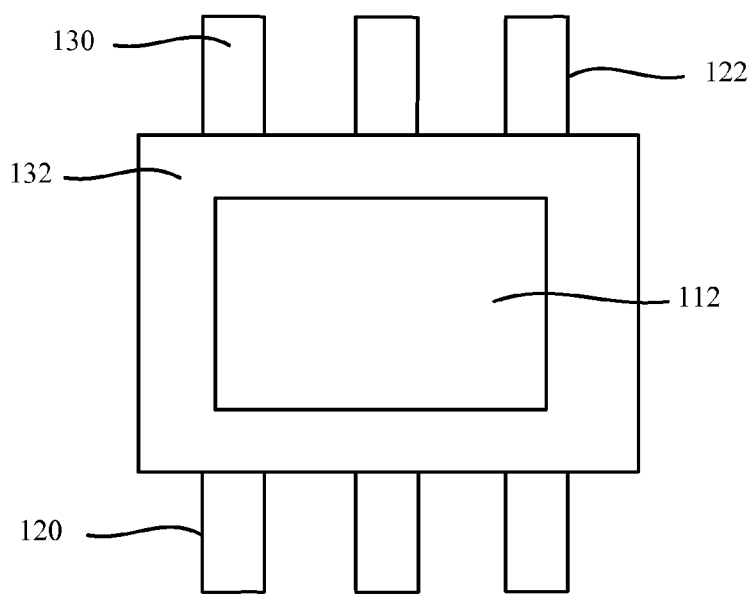

In various embodiments, the bottom IC die 102 includes a thin metallic layer 112 deposited onto the back surface 114 of the die as best illustrated in FIG. 1D, which illustrates the bottom surface of the package 100. The thin metallic layer 112 may be formed from any suitable metal or metallic alloy. By way of example, the thin metallic layer 112 may be an alloy of titanium, nickel and silver. The thin metallic layer 112 may also be applied to the back surface 114 of the die 102 with any suitable means including, for example, sputtering. The metallic layer 112 may serve as a heat dissipation medium for transferring thermal energy out of the die 102. In various embodiments, the back surface 114 of the die 102 is intended to be soldered directly to a desired substrate, such as a PCB, to provide for enhanced heat dissipation out of the die. Since solder does not generally adhere well to Si, the metallic layer may serve as an intermediary between the solder and the Si. In other embodiments, such as in analog applications, it is desirable to electrically connect the back surface 114 of the die 102 to a PCB to allow control over the electrical potential of the back region of the die. In some embodiments, a similar thin metallic layer 116 is also deposited onto the back surface 118 of the top die 104.

Package 100 additionally includes a leadframe having a plurality of leads 120. Each lead 120 may be configured as a power lead intended for coupling to an external power or ground line. By way of example, power leads 120 may be configured to carry at least approximately 1 Watt. In other applications, each power lead 120 may be configured to carry much higher powers. Each lead 120 includes an inner lead finger portion 120a, a middle lead portion 120b and an outer lead portion 120c. In various embodiments, the leads 120 are arranged such that the inner lead finger portions 120a are arranged in interlaced adjacent rows over the active surface 106 of the first bottom die 102. More specifically, the leads 120 may be arranged such that the middle portion 120b and outer portion 120c of each lead 120 is positioned on an opposite side of the die 102 as the middle and outer lead portions of the leads 120 immediately adjacent to the respective lead.

In the embodiment illustrated in FIGS. 1A-D, which illustrate a dual inline package (DIP) format, four leads 120 are configured such that the four associated inner lead finger portions 120a are arranged in four interlaced rows over the active surface 106 of the bottom die 102. The outer portions 120c of the corresponding leads 120 are arranged such that two of the outer portions 120c of the leads 120 extend from each of two opposite sides of the package 100.

Furthermore, a number of signal leads 122 may be provided in addition to the power leads 120. For example, in the illustrated embodiment, two signal leads 122 are provided. The illustrated leads are arranged on opposite sides of one end of the package 100. In other embodiments, package 100 may include only one signal lead 122, while in still other embodiments, package 100 may include more than two signal leads 122. Leads 122 are generally intended for connection to signal or control lines and any suitable number of signal leads 122 may be present in package 100. The associated inner regions 122a of the leads 122 may be positioned in a single row over the active surface 106 of the bottom die 102 as illustrated in FIG. 1C. The outer portions 122c of the leads 122 are arranged to extend from opposite sides of the package 100. The described arrangement forms a DIP 100 having five rows of leads over the active surface 106 of the die 102 and six corresponding external outer lead portions 120c and 122c, three of which (two outer portions 120c and one outer portion 122c) extend from each of two opposite sides of the package 100.

Package 100 may also include a number of additional internal leads 124. Internal leads 124 may be used to connect associated bond pads 110 on the active surfaces 106 and 108 of the two dice 102 and 104 with one another. In the illustrated embodiment, the internal leads 124 do not extend out of the package 100. The leads 124 enable the dice 102 and 104 to communicate with one another. By way of example, in one embodiment, one of the dice 102 or 104 may serve as a master chip that regulates the operations of the other die. In one alternate embodiment, bond pads 110 on each of the respective dice 102 and 104 may be connected with one another with larger solder joints that span the gap between associated bond pads 110 on each of the respective dice thereby eliminating the need for the leads 124.

Each of the inner lead portions 120a and 122a and the internal leads 124 includes at least one conductive solder pad 126. The inner lead portions 120a and 122a are arranged such that the solder pads 126 are positioned adjacent corresponding bond pads 110 on the active surfaces 106 and 108 of the dice 102 and 104, respectively. Each bond pad 110 is physically and electrically connected to one of the associated leads 120, 122 or 124 with a solder ball joint 128. In various embodiments, the outer portions 120c and 122c of the leads 120 and 122 additionally include package contacts 130 on the bottom surfaces of the leads. In some embodiments, the leads 120, 122 and 124 may be etched, half-etched, or otherwise thinned relative to the solder pads 126 and/or package contacts 130 as will be described in more detail below.

It many embodiments, a single lead 120 or 122 may be electrically and physically connected with one or more bond pads 110 on each of the dice 102 and 104, as illustrated in FIGS. 1A and B. This leadframe arrangement especially facilitates the packaging of dice 102 and 104 whose respective active surface 106 and 108 and associated bond pads 110 are mirror images of one another. More specifically, a single lead 120 or 122 may be used to bias bond pads 110 on both dice 102 and 104 simultaneously.

In various embodiments, one or more leads 120 are each connected with multiple I/O pads 110 on each of the active surfaces 106 and 108 of the dice 102 and 104. By way of example, a single inner lead finger 120a may include multiple solder pads 126, each of which is to be physically and electrically bonded to one of multiple I/O pads 110 designated for connection with power or ground lines, which typically carry higher current and power. The number of I/O pads 110 connected with each lead 120 may vary widely. By way of example, anywhere from 1 to 8 I/O pads 110 on each die 102 and 104 may be connected with corresponding solder pads 126 on a single lead 120. In some high power applications, an even greater number of I/O pads may be connected with a single lead 120. In the embodiment illustrated in FIGS. 1A-D, the leads 120 that are intended for connection to higher current power or ground lines and are each connected with three corresponding I/O pads 110 on each of the top and bottom dice 104 and 102. In contrast, the leads 122 are generally intended for connection to signal or control lines and are each connected with a single I/O pad 110 on each of the top and bottom dice 104 and 102 via a single solder joint 128.

In some embodiments, the leads may be etched to form recessed regions 121 around the solder pads 126 on both sides of the leads 120 in order to prevent the spread of solder between adjacent solder pads 126 and along other surfaces of each lead. The recessed regions 121 essentially form a moat around each solder pad 126 that serves to isolate the solder pad from the rest of the associated lead surfaces. The recessed regions 121 may be formed by any suitable means. By way of example, the recessed regions 121 may be formed by etching the top surface of the lead frame panel. The formation and use of recessed regions to isolate solder pads is described in more detail in U.S. patent application Ser. No. 11/691,429, which is incorporated by reference herein.

Each recessed region 121 is recessed sufficiently from the surface of the solder pads of the associated leads to prevent flux and solder from spreading to undesired surfaces of the lead 120. More particularly, the recessed regions 121 are preferably etched sufficiently deep such that the spread of flux or solder is limited to the solder pads 126 by the surface tension of the flux or solder, respectively. By way of example, the recessed regions 121 are preferably recessed to a depth in the range of approximately 2 to 4 mils in typical lead frame designs although deeper or shallower recessed regions may be provided. In one preferred embodiment the recessed regions on both sides of the leads are half-etched simultaneously thus saving valuable processing time. The aforementioned recess depths work well for a variety of solder pad geometries and sizes.

It should be appreciated that the resulting "raised" solder pads limit the spread of solder since (a) they tend to define the areas cleaned by flux, and (b) the surface tension of the solder tends to further help prevent the solder from extending beyond the edges of the solder pads 212.

In one embodiment, the recessed regions 121 are etched such that the solder pads 126 are substantially circular. In an alternate embodiment, the solder pads 126 may be substantially oval, rectangular or square (with or without rounded corners). However, in many applications it is preferable to have substantially circular solder pads rather than rectangular solder pads or other solder pads having geometries with sharp corners. More particularly, sharp corners may have the effect of counteracting the forces of surface tension that confine the flux and solder to the surfaces of the solder pads 126. Additionally, in some applications it will be desirable to form solder pads 126 wider than other portions of their associated leads 208.

The recessed regions 121 preferably extend to a sufficient length along the leads so that the flux may not bridge the recessed regions between the solder pads 126 and the rest of the leads. Additionally, in some embodiments it may be desirable for the recessed regions 121 to extend to a greater length.

It should be appreciated that the solder pads 126 defined by the recessed regions 121 may also be advantageously used to control the standoff height between the leads and an associated die. The standoff height between the leadframe (e.g., solder pad 126) and the die (e.g., I/O pad 110) is generally a function of the volume of solder in the solder bump 128 as well as the surface area and geometry of the associated UBM (or I/O pad 110) and solder pad 126. Therefore, by controlling the volume of solder as well as the surface areas and geometries of the solder pad 126 and I/O pad 110, a desired standoff height may be achieved. Furthermore, since the same process may be applied to every solder joint, a uniform standoff height may be achieved across the entire die.

In the embodiment illustrated in FIG. 1A, the dice 102 and 104 are offset from one another. The offset results from the staggering of the solder pads 126 on opposite sides of the leads. More particularly, the recessed regions 121 in FIG. 1A are half etched and as such, the solder pads 126 on both sides of the lead 120 may not overlie one another. In other embodiments, the recessed regions 121 may be recessed to a depth of less than halfway through the lead thereby allowing the solder pads 126 on both sides of the lead to directly overlie one another thereby permitting the dice to directly overlie one another.

As will be appreciated by those familiar with the art, power or ground lines generally carry higher current than other signal or control lines. The aforementioned arrangement allows the current through a single lead 120 to be shared by multiple associated I/O pads 110 on each of the top and bottom dice 104 and 102, and their associated solder ball joints 128. The amount of current carried by each solder joint 128 is limited in part by the size of the solder joint (e.g., the diameter of the solder joint). The diameter of the solder joint 128 is, in turn, generally limited by the size of the corresponding I/O pad 110, which is in turn limited by the available real estate on the active surfaces 106 and 108 of the dice 102 and 104. More particularly, for a given die footprint, the layout (distribution), size and shape of the I/O pads 110 is limited by the regions on the active surfaces of the dice available for bonding and the total area of the active surfaces of the dice as well as proximity constraints placed on the I/O pads.

Those familiar with the art will appreciate that the current carrying and heat dissipation capabilities of solder ball joints far exceed those of bonding wires. Generally, as the number and diameter of the solder ball joints 128 increase, the current carrying and heat dissipation capabilities increase. Additionally, as the diameters of the solder ball joints 128 increase, the resistance through the solder ball joints decreases. As a result of their larger diameters and the relatively shorter distance traveled through a solder ball joint as compared to a typical bonding wire, the electrical resistance through solder ball joints is far below that of typical bonding wires. By way of example, a typical solder ball joint may have a resistance of approximately 0.5 mΩ while a corresponding bonding wire used in a similar application may have a resistance in the range of approximately 60 to 100 mΩ.

It will be appreciated by those skilled in the art that, although a specific lead frame arrangement has been described and illustrated, embodiments of the present invention may utilize an extremely wide variety of other leadframe configurations as well. Additionally, although described with references to top and bottom dice and various surfaces, it should be appreciated that this context is intended solely for use in describing the structure and may not coincide with the final orientation of the package after subsequent attachment to a PCB or other suitable substrate.

In the illustrated embodiment, portions of the dice 102 and 104 and leads 120, 122 and 124 are encapsulated with a molding material or compound 132. The molding compound is generally a non-conductive plastic or resin having a low coefficient of thermal expansion. Package 100 may be encapsulated in such a way as to prevent molding material 132 from covering or intruding over the metallic layer 112 on the back surface 114 of the bottom die 102. Package 100 may also be encapsulated such that molding material is prevented from covering or intruding over a metallic layer 116 on the back surface 118 of the top die 104. The molding material does encapsulate other portions of the dice 102 and 104, the solder joints 128, leads 124 and generally at least the inner portions 120a and 122a and middle portions 120b and 122b of the leads 120 and 122, respectively. In the embodiment illustrated in FIGS. 1A-1D, the outer portions of the leads 120 and 122 extend from the sides of the encapsulated package 100 and are bent into a characteristic gull-wing formation to facilitate electrical connection with a printed circuit board (PCB) or other suitable substrate. Additionally, the package contacts 130 on the bottom surfaces of the leads 120 and 122 may be configured so as to be coplanar with the bottom or back surface of the metallic layer 112.

Figure 2A:
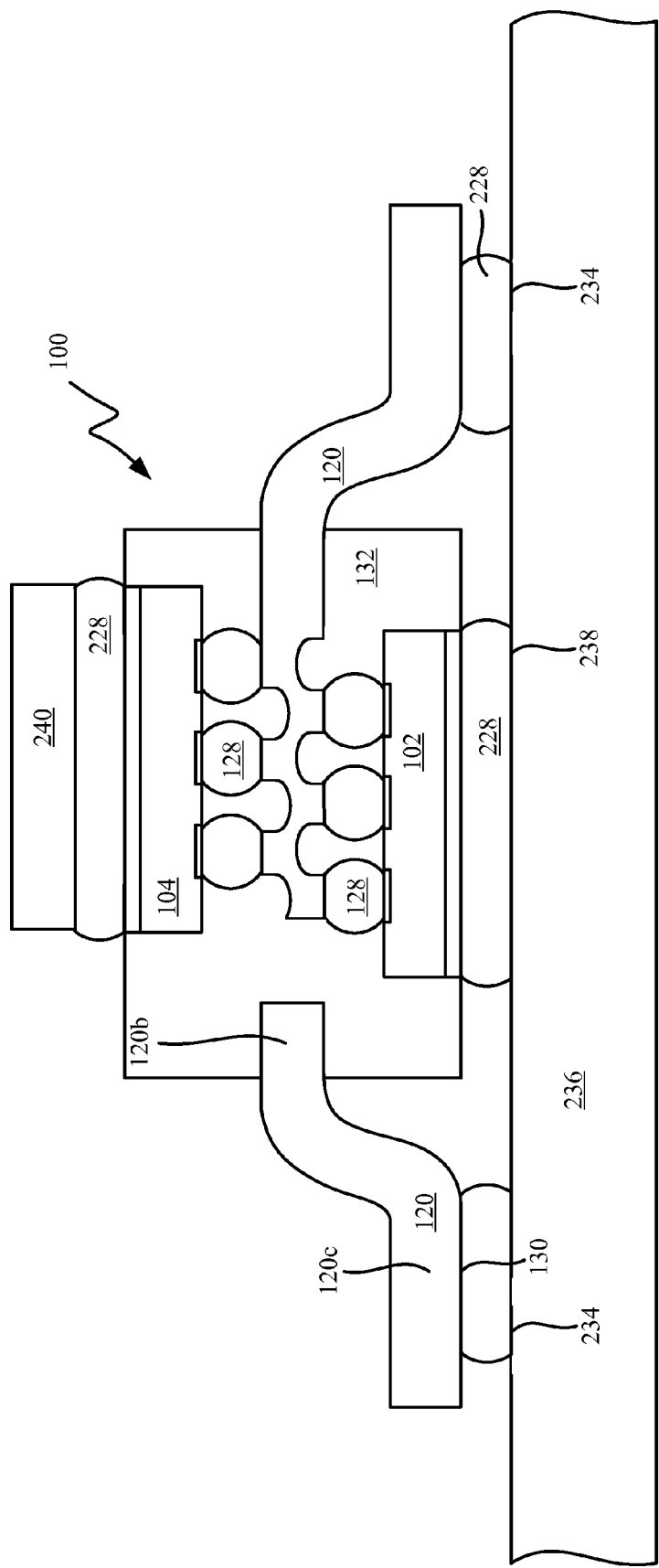
FIGS. 2A-B illustrate diagrammatic cross-sectional side and cross-sectional top views of the IC package of FIG. 1 mounted on a printed circuit board in accordance with an embodiment of the present invention.
Figure 2B:
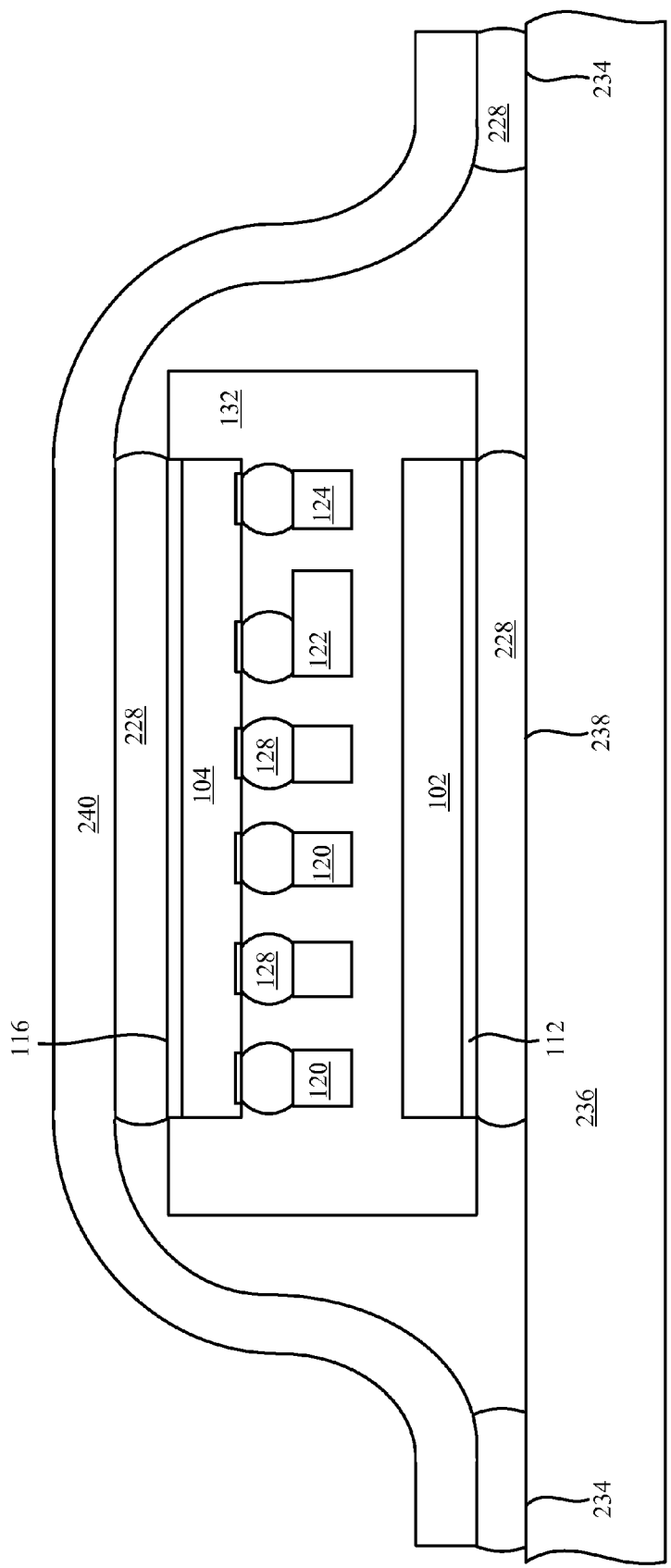

In the embodiment illustrated in FIGS. 2A and B, the package contacts 130 on the bottom surfaces of the leads 120 and 122 of package 100 are physically and electrically connected with corresponding contacts 234 on a PCB 236 via solder joints 228. In various embodiments, the metallic layer 112 is also physically and electrically connected to an associated contact surface 238 on the PCB 236. Additionally, in some embodiments, a heat sink 240 may be soldered to the metallic layer 116 on the top die 104. In the illustrated embodiment, the heat sink 240 is also soldered to corresponding contact surfaces 242 on the PCB 236. Although a specific heat sink 240 is illustrated, it will be appreciated that any suitable heat sink may be incorporated.

The described arrangement provides multiple efficient and direct mechanisms for dissipating heat out of the package 100. More particularly, by soldering or otherwise connecting the metallic layer 112 on the back surface 114 of the bottom die 102 to the PCB 236, a direct thermally conductive path is created between the die 102 and the PCB 236. Additionally, the heat sink 240 provides an efficient means for transferring heat out of the top of the package 100. Furthermore, as already described, the solder joints 128 also provide an efficient thermal path for dissipating thermal energy out of the package 100 via the leads 120 to the contacts 234 on the PCB 236. Thus, embodiments of the present invention provide three efficient means of dissipating heat out of the package 100.

Furthermore, the described arrangement of the dice 102 and 104 and leads 120, 122 and 124 enables the production of a package 100 having double the effective silicon density and hence potentially double the performance while maintaining a conventional package size. Conversely, one could retain a desired silicon density and performance while halving the footprint of the package. More specifically, by advantageously utilizing the volume in the top half of the package to incorporate a second die, the number of transistors for a given package footprint may be doubled. Moreover, by soldering the exposed metallic layer on the back surface of the bottom die to a PCB and/or soldering a heat sink to an exposed metallic layer on the back surface of the top die, the thermal performance of the package is increased sufficiently to enable the full utilization of both dice. Furthermore, in embodiments in which mirror image dice are used, no additional leads are required as each lead may be connected with corresponding I/O pads on both dice.

Figure 3B:
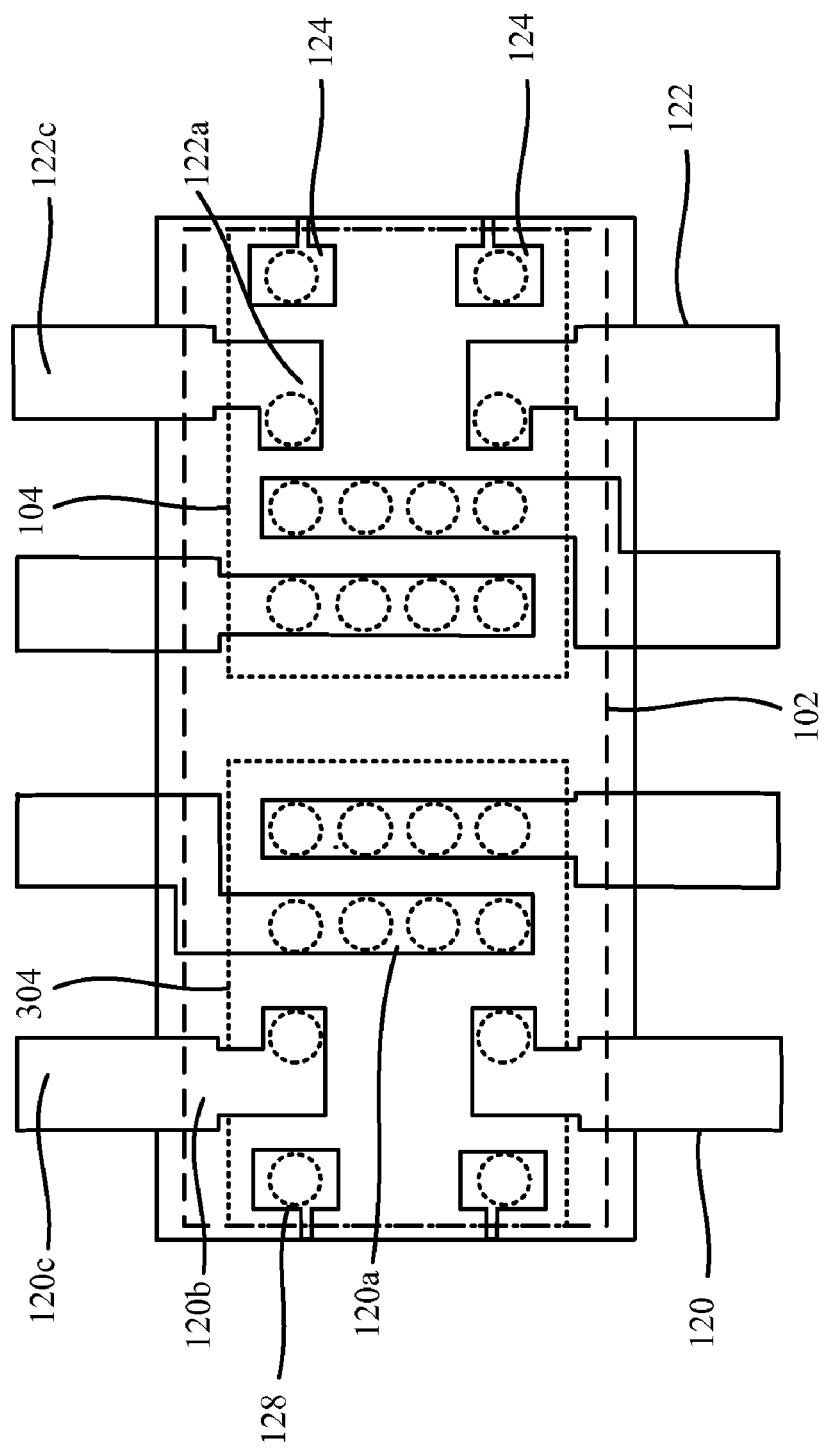

Although the embodiments described thus far have focused on the packaging of two IC dice, it will be appreciated that, in other embodiments, more than two dice may be packaged into a single IC package as well. By way of example, FIGS. 3A and 3B illustrate an alternative embodiment of a package 100 which includes two top dice 104 and 304. In the embodiment illustrated in FIG. 3B, the perimeter of the bottom die 102 is illustrated with a dashed line while the perimeters of the top dice 104 and 304 are each illustrated with dotted lines. In some embodiments, one or both of the top dice 104 and 304 may be utilized as a control chip for regulating operations in the bottom die 102. In these embodiments, bond pads 110 on one or both of the dice 104 and 304 may be connected with bond pads on the bottom die 102 via internal leads 124. Depending upon the application, the top dice 104 and 304 may or may not include exposed metallic layers on their respective back surfaces. In some embodiments, the top dice 104 and 304 may also be electrically connected with one another to permit electrical communication therebetween. As will be appreciated by those of skill in the art, the described arrangement facilitates the production of system-in-package (SIP) or multi-chip module (MCM) package designs. Furthermore, although only a single embodiment of a three-chip (die) package is illustrated, it will be appreciated that both the number and arrangement of the leads and dice may vary widely.

Figure 4:
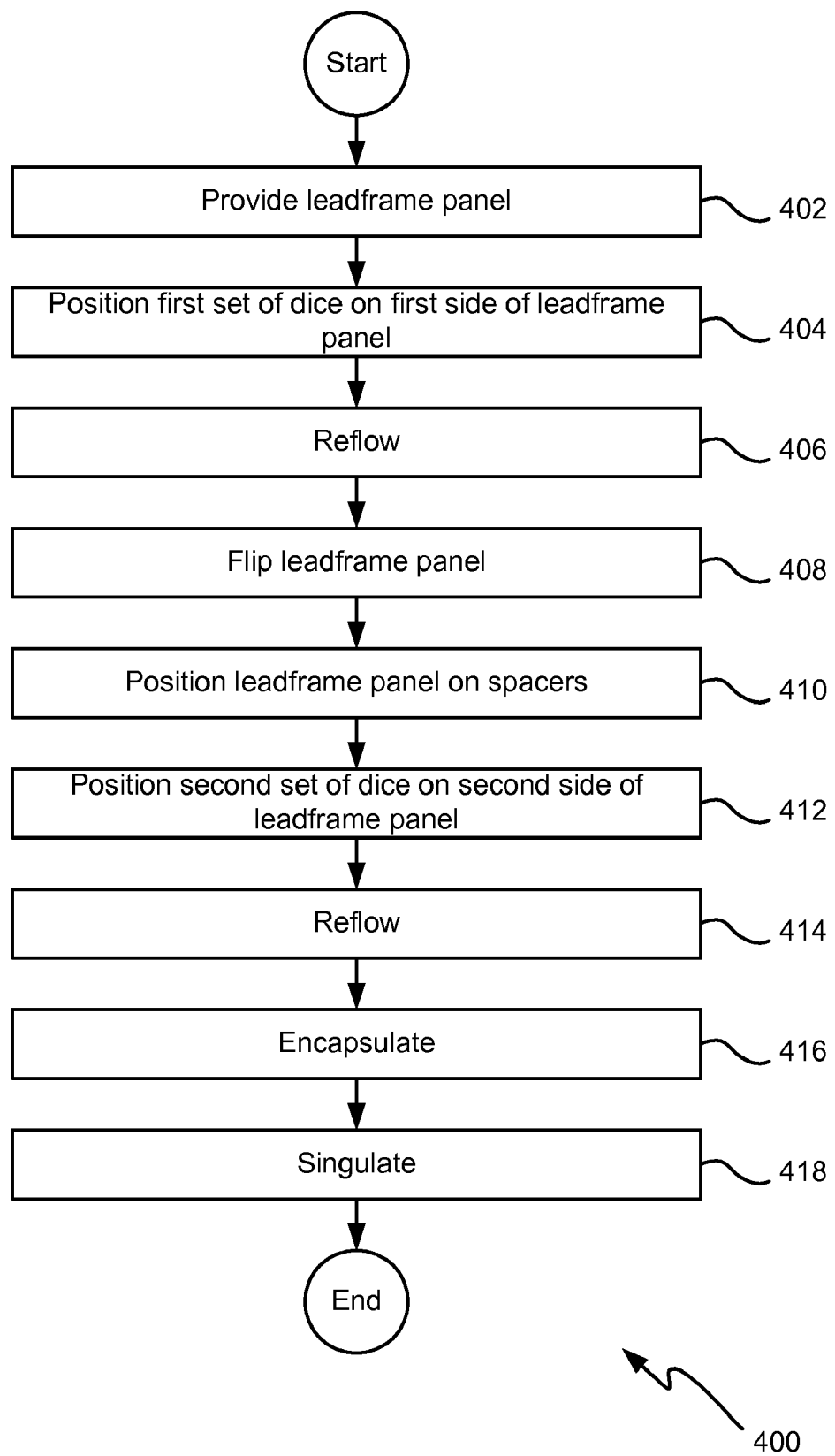
FIG. 4 is a flow chart illustrating a process of packaging integrated circuit dice in accordance with an embodiment of the present invention.
Figure 5:
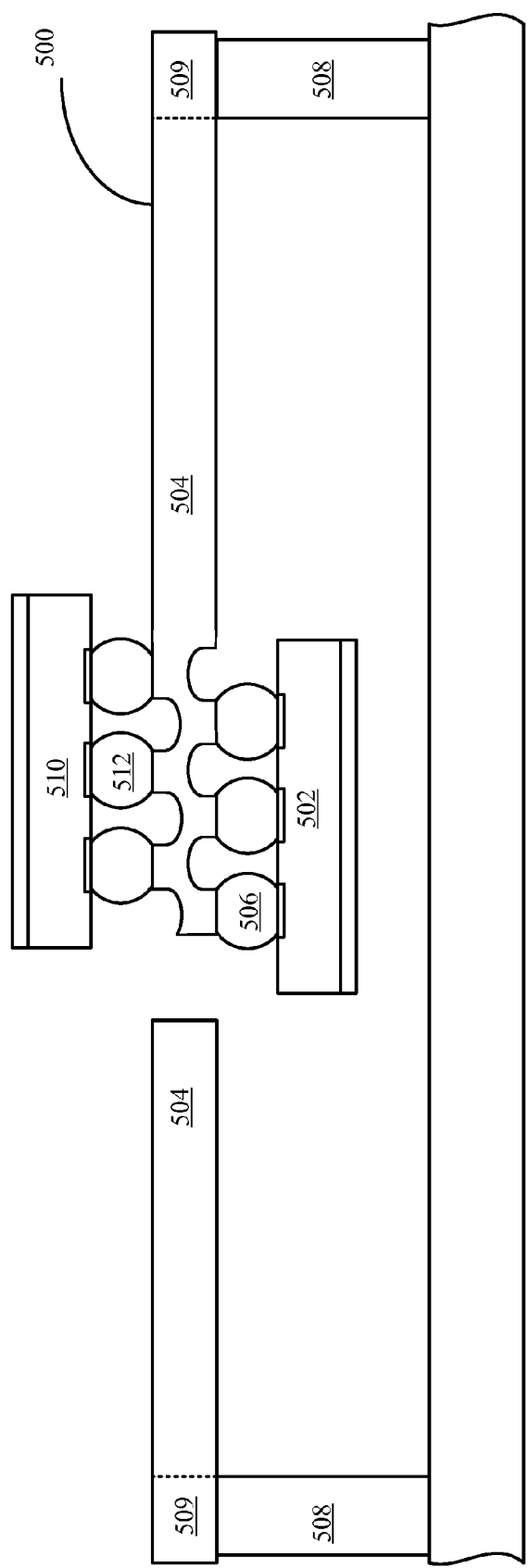
FIG. 5 illustrates an arrangement in which dice are mounted to each other on two opposite sides of a leadframe.

With reference to FIGS. 4 and 5 a process 400 of packaging at least two integrated circuit dice with a single leadframe device area will be described. A leadframe such as those described above is provided at 402. At 404 a first die is positioned onto a first side of the leadframe. It will be appreciated that in various embodiments the leadframe is a single leadframe device area of a larger leadframe panel having a multitude of leadframe device areas each of which is suitable for use in packaging IC dice. By way of example, the leadframe panel may be in the form of a strip with side rails and other supporting structures supporting the device areas of the leadframe panel. In these embodiments, dice may be positioned on each device area of the leadframe panel. Additionally, in some embodiments, multiple dice may be positioned within a single device area (such as in the embodiment illustrated in FIGS. 3A and 3B described above).

In various embodiments, one or both of the dice and/or leads of the leadframe panel include solder bumps deposited thereon. At 406, the solder bumps are reflowed to form solder joints that physically and electrically connect the solder pad surfaces on the leads and I/O pads on the dice.

At 408 the populated leadframe or leadframe panel is flipped and subsequently positioned on a set of spacers at 410.

FIG. 5 illustrates a single leadframe device area 500 having a first die 502 physically and electrically connected to leads 504 on a first side of the leadframe via a first set of solder joints 506. In the illustrated embodiment, side rails 509 of the leadframe panel are each positioned onto a spacer 508 to support the leadframe such that the dice 502 do not have to rest on any other surface.

At 412 a second die (or set of dice) 510 is positioned onto the second side of the leadframe such that I/O pads on the second die are positioned over the same leads 504 used to connect the first die. The populated leadframe 500 is then reflowed again at 414 to produce solder joints 512 that physically and electrically connect the bottom die (or dice) 510 to the second sides of the same leads 504. It should be noted that since the spacers 508 support the leadframe 500 during the second reflow the weight of the leadframe, dice and solder does not compress the first set of solder joints 506 which are also melted during the second reflow. Additionally, it has been observed that the cohesion of the solder in the solder joints 506 is sufficient to support the hanging dice 502 during the second reflow. Subsequently, the populated leadframe panel is then encapsulated at 416 and singulated to produce individual IC packages (if necessary) at 418.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of packaging at least two integrated circuit dice into a single integrated circuit package utilizing a single leadframe, the method comprising:
    positioning a first die onto a first side of a leadframe such that I/O pads on the first die are positioned adjacent corresponding solder pads on first sides of selected leads of the leadframe, the first die including an active surface with the I/O pads and an opposing back surface;
    reflowing solder bumps positioned between the I/O pads on the first die and the solder pads on the first sides of the leads to produce a first plurality of solder joints that physically and electrically connect the first die to the leads of the leadframe;
    positioning the leadframe onto a set of spacers such that the first die is below the leadframe, the spacers being arranged to physically support the leadframe;
    positioning a second die onto a second side of the leadframe opposite the first side of the leadframe such that I/O pads on the second die are positioned adjacent corresponding solder pads on second sides of the selected leads of the leadframe; and
    reflowing solder bumps positioned between the I/O pads on the second die and the solder pads on the second sides of the leads to produce a second plurality of solder joints that physically and electrically connect the second die to the leads of the leadframe, whereby the spacers support the leadframe such that during the second reflowing the first plurality of solder joints are not substantially compressed by the weight of the leadframe.

2. A method as recited in claim 1, wherein the first plurality of solder joints are melted during the second reflowing and wherein the cohesion of the solder in the first plurality of solder joints is sufficient to support the weight of the first die.

3. A method as recited in claim 1, wherein selected I/O pads on the first die and selected I/O pads from the second die are connected to the same leads.

4. A method as recited in claim 1, wherein multiple I/O pads on the first die are connected with a single selected lead and wherein multiple I/O pads on the second die are connected with the same single selected lead.

5. A method as recited in claim 1, wherein after the positioning of the leadframe on the set of spacers, the first die is elevated such that the back surface of the first die is not in contact with any other surface.

6. A method as recited in claim 1, wherein the leadframe is a single leadframe device area of a larger leadframe panel that includes a plurality of device areas, each device area being arranged to support two dice on two opposing surfaces of the device area, respectively.

7. A method as recited in claim 1, further comprising encapsulating the leadframe panel and singulating the leadframe panel to produce a plurality of integrated circuit packages each including at least two dice.

8. A method as recited in claim 1, wherein:
    the back surface of the first die faces in a first direction during the first reflowing process; and
    the method further comprises flipping the leadframe after the first reflowing and before the second reflowing such that the back surface of the first die faces in a second direction.

9. A method as recited in claim 1, wherein:
    the set of spacers extends out from a base structure; and
    the positioning of the leadframe onto the set of spacers holds the first die over and away from the base structure, such that the back surface of the first die faces the base structure and is not in direct contact with the base structure.

10. A method as recited in claim 1, wherein after the positioning of the leadframe onto the set of spacers, the first die is carried by the solder bumps that connect the first die to the leadframe and is not directly physically supported by any other structure that underlies the back surface of the first die.

11. A method as recited in claim 1, wherein during the second reflowing, the first plurality of solder bumps carries the weight of the first die.

12. A method of packaging at least two integrated circuit dice into a single integrated circuit package utilizing a single leadframe, the method comprising:
    positioning a first die onto a first side of a leadframe such that I/O pads on the first die are positioned adjacent corresponding solder pads on first sides of selected leads of the leadframe, the first die including an active surface with the I/O pads and an opposing back surface;
    reflowing solder bumps positioned between the I/O pads on the first die and the solder pads on the first sides of the leads to produce a first plurality of solder joints that physically and electrically connect the first die to the leads of the leadframe;
    flipping the leadframe;
    positioning the leadframe onto a set of spacers, wherein the set of spacers physically support the leadframe and are not in direct contact with the first die, the spacers helping to suspend the first die over a surface of an underlying structure such that there is a gap between the back surface of the first die and the surface of the structure, wherein the back surface of the first die is prevented from pressing directly against the surface of the structure;

positioning a second die onto a second side of the leadframe opposite the first side of the leadframe such that I/O pads on the second die are positioned adjacent corresponding solder pads on second sides of the selected leads of the leadframe; and reflowing solder bumps positioned between the I/O pads on the second die and the solder pads on the second sides of the leads to produce a second plurality of solder joints that physically and electrically connect the second die to the leads of the leadframe, whereby the spacers support the leadframe such that during the second reflowing the first plurality of solder joints are not substantially compressed by the weight of the leadframe and wherein the first plurality of solder joints maintain sufficient structural integrity during the second reflowing such that the first die is carried by the first plurality of solder joints during the second reflowing without receiving additional support from any support structure that underlies and is in contact with the back surface of the first die.

\* \* \* \* \*